United States Patent
Yu et al.

(10) Patent No.: US 7,977,772 B2
(45) Date of Patent: *Jul. 12, 2011

(54) HYBRID METAL FULLY SILICIDED (FUSI) GATE

(75) Inventors: Chen-Hua Yu, Hsin-Chu (TW); Cheng-Tung Lin, Jhudong Township (TW); Cheng-Hung Chang, Hsin-Chu (TW); Hsiang-Yi Wang, Hsin-Chu (TW); Chen-Nan Yeh, Hsi-Chih (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/777,937

(22) Filed: May 11, 2010

(65) Prior Publication Data

US 2010/0221878 A1    Sep. 2, 2010

Related U.S. Application Data

(63) Continuation of application No. 11/863,804, filed on Sep. 28, 2007, now Pat. No. 7,745,890.

(51) Int. Cl.
*H01L 21/4763* (2006.01)
(52) U.S. Cl. ........ 257/649; 438/655; 438/664; 438/682; 438/755; 257/413
(58) Field of Classification Search .................. 257/357, 257/369, 371, 384, 377, 413; 438/649, 655, 438/664, 682, 755
See application file for complete search history.

(56) References Cited

U.S. PATENT DOCUMENTS

| | | | |
|---|---|---|---|
| 6,410,376 B1 | 6/2002 | Ng et al. | |
| 6,468,851 B1 | 10/2002 | Ang et al. | |
| 6,586,288 B2 | 7/2003 | Kim et al. | |
| 6,645,818 B1 | 11/2003 | Sing et al. | |
| 7,745,890 B2 * | 6/2010 | Yu et al. | 257/413 |
| 2006/0084247 A1 | 4/2006 | Liu | |
| 2007/0007602 A1 | 1/2007 | Oda et al. | |
| 2008/0157212 A1 | 7/2008 | Lavoie et al. | |

OTHER PUBLICATIONS

Jeon, I.S., et al., "A Novel Methodology on Tuning Work Function of Metal Gate Using Stacking Bi-Metal Layers," International Electron Devices Meeting Technical Digest, 2004, pp. 303-306, IEEE.
Lu, C-H, et al., "Characteristics and Mechanism of Tunable Work Function Gate Electrodes Using a Bilayer Metal Structure on $SiO_2$ and $HfO_2$," IEEE Electron Device Letters, Jul. 2005, pp. 445-447, vol. 26, No. 7, IEEE.

* cited by examiner

*Primary Examiner* — Tan N Tran
(74) *Attorney, Agent, or Firm* — Slater & Matsil, L.L.P.

(57) ABSTRACT

A semiconductor device and system for a hybrid metal fully silicided (FUSI) gate structure is disclosed. The semiconductor system comprises a PMOS gate structure, the PMOS gate structure including a first high-κ dielectric layer, a P-metal layer, a mid-gap metal layer, wherein the mid-gap metal layer is formed between the high-κ dielectric layer, the P-metal layer and a fully silicided layer formed on the P-metal layer. The semiconductor system further comprises an NMOS gate structure, the NMOS gate structure includes a second high-κ dielectric layer, the fully silicided layer, and the mid-gap metal layer, wherein the mid-gap metal layer is formed between the high-κ dielectric and the fully silicided layer.

20 Claims, 12 Drawing Sheets

HYBRID METAL FULLY SILICIDED (FUSI) GATE

This application is a continuation of U.S. patent application Ser. No. 11/863,804, entitled "Hybrid Metal Fully Silicided (FUSI) Gate," filed Sep. 28, 2007, which application is hereby incorporated herein by reference.

TECHNICAL FIELD

The present invention relates generally to a system and method for manufacturing semiconductor devices, and more particularly to a method of manufacturing and a system for a hybrid metal fully silicided (FUSI) gate structure.

BACKGROUND

As CMOS technology continued to scale, metal gate electrodes were introduced to overcome the deleterious effects of doped polysilicon, namely gate electrode depletion, high resistance, and incompatibility with high-κ gate dielectrics. Every metal has a characteristic work function, which is a key material parameter that affects device threshold voltage. A work function is the energy needed to move an electron in the solid atom from the Fermi level to the valance band. Ideally, the Fermi energy value of a metal gate in NMOS area exists near a conduction band of silicon, while that of the other metal gate in the PMOS area exists near a valance band of silicon. Therefore, dual-metal gates using different metals may be conventionally used for NMOS and PMOS transistors. A method of forming dual-metal gates in a semiconductor device according to the prior art is explained by referring to FIG. 1a to FIG. 1d as follows.

FIGS. 1a to 1d illustrate cross-sectional views of the process of forming gates in a semiconductor device according to the prior art. Referring to FIG. 1a, a semiconductor substrate 10, having an STI region 12 is provided. An N well and a P well (not shown in the drawings) are formed respectively in the semiconductor substrate 10 using masking and ion implantation processes known in the art. A high-κ gate dielectric 14 is deposited. A P-metal layer 16 is disposed on the high-κ dielectric. The P-metal layer 16 is formed of a metal material of which the Fermi energy lies near a valance band of silicon. Referring to FIG. 1b, the P-metal 16 at NMOS area 18 is etched away. The high-κ gate dielectric 14 may be damaged. As illustrated in FIG. 1c, the N-metal 20 is then deposited. The N-metal 20 is a metal material of which the Fermi energy lies near a conduction band of silicon. In FIG. 1d, the N-metal 20 at the PMOS area is shown etched away. Thus, a conventional dual metal gate structure is fabricated.

One disadvantage of the prior art is that the conventional dual metal gate process uses two separate metals for NMOS and PMOS. The metal etching process uses the gate dielectric as a stop layer, potentially damaging the gate dielectric. Further, the dual metal gate process is complex and is therefore expensive to manufacture.

Another method of processing is a phase-controlled FUSI gate process. The phase-controlled FUSI gate process uses different silicide phases to control the effective work function of the PMOS and NMOS transistors. Different silicide phases of Ni include NiSi, $Ni_2Si$, $Ni_3Si$, etc. A suitable threshold voltage may be realized for both PMOS and NMOS based on the composition control of Hf in the dielectric film and Ni in the electrode. NiSi and $Ni_3Si$ electrodes may be formed on a $HfO_2$ composition for NMOS and PMOS. A description of a process for forming a phase-controlled FUSI gate in a semiconductor device according to the prior art is explained by referring to FIG. 2a to FIG. 2q as follows.

Referring to FIG. 2a, a semiconductor substrate 20, having an isolation dielectric between an N-well and a P-well structure (not shown) is provided. A high-κ gate dielectric 22 is deposited, and a poly-Si gate stack 24 comprising poly/oxide/poly layers is then disposed. A hard mask 26 is deposited for gate patterning. FIG. 2b shows substrate 20 following a gate etch step. FIG. 2c illustrates a series of process steps, including a dummy spacer 28 deposition (dummy spacer may include an oxide film and/or a SiN film), a PMOS photolithography, and a spacer/recess etch 30. FIG. 2d shows the result of a SiGe deposition 32. In FIG. 2e, the dummy spacer is removed. FIG. 2f is a view of substrate 20 after a pocket LDD implant 34 has been performed, and a SiN offset spacer 36 has been formed. FIG. 2g shows a cross-sectional view of the substrate following spacer 38 formation (main spacer may include an oxide film and/or a SiN film), source/drain 40 implants, anneals, and an RPO 42 (such as silicon oxide). FIG. 2h shows RPO removal and nickel metal deposition 44 for the silicidation process on the source/drain regions 40. FIG. 2i shows the source/drain regions 40 after silicidation. FIG. 2j shows capping oxide/SiN dep 46 (capping layer may include an oxide film and/or a SN film). FIG. 2k shows PR coating 48. FIG. 2l shows the gate stack 24 following a series of etch back processes to expose the top of the gate stack 24. FIG. 2m shows capping SiN 46 removal, and FIG. 2n shows capping oxide/hard mask 26 removal. FIG. 2o shows PR 48 strip. Next, the polysilicon gate stack 24 is etched back in the PMOS area 50 only (using photoresist to block NMOS area, not shown) in FIG. 2p. Therefore, the polysilicon gate stack 24 in the PMOS area is thinner than the polysilicon gate stack 24 in the NMOS area. Finally, a thick Ni metal deposition and full silicidation 52 of the remaining gate poly follows, with the resultant cross sectional view shown in FIG. 2q. This configuration has a PMOS area with metal-rich silicide, such as $Ni_3Si$, which is suited for P-FET, and an NMOS area with mono-silicide, NiSi, which is suited for an N-FET.

An unfortunate artifact of the phase-controlled FUSI gate process is that it forms different thicknesses of poly, causing height differences between the NMOS and PMOS. This process, just as the dual metal process discussed above, is also complex, and may introduce variation during the PMOS polysilicon etch back process. The process used to achieve full-gate silicidation may induce an unacceptable amount of stress in the circuitry and degrade integrity of gate dielectric.

SUMMARY OF THE INVENTION

These and other problems are generally solved or circumvented, and technical advantages are generally achieved, by preferred embodiments of the present invention which relates to a structure and method for making a hybrid metal FUSI gate structure.

In accordance with an illustrated embodiment, a semiconductor device and system for a hybrid metal fully silicided (FUSI) gate structure is disclosed. The semiconductor system comprises a PMOS gate structure, the PMOS gate structure including a first high-κ dielectric layer, a P-metal layer, a mid-gap metal layer, wherein the mid-gap metal layer is formed between the high-κ dielectric layer, the P-metal layer and a fully silicided layer formed on the P-metal layer. The semiconductor system further comprises an NMOS gate structure, the NMOS gate structure includes a second high-κ dielectric layer, the fully silicided layer, and the mid-gap metal layer, wherein the mid-gap metal layer is formed between the high-κ dielectric and the fully silicided layer.

In accordance with another illustrated embodiment, a method of forming a semiconductor device comprises providing a semiconductor substrate having a PMOS area and an NMOS area and forming a dielectric layer on the PMOS area and the NMOS area. A mid-gap metal layer is formed on the dielectric layer. A PMOS gate electrode is formed, wherein the forming the PMOS gate electrode comprises forming a P-metal layer on the mid-gap metal layer and forming a first polysilicon region on the P-metal layer. An NMOS gate electrode is formed, wherein the forming the NMOS gate electrode comprises forming a second polysilicon region disposed on the mid-gap metal layer. The first polysilicon region and the second polysilicon region are silicided until the first polysilicon region and the second polysilicon region are fully silicided.

In accordance with another embodiment, a method of forming a semiconductor device comprises forming a PMOS gate structure and an NMOS gate structure. The forming the PMOS gate structure comprises forming a first high-κ dielectric layer, forming a first mid-gap metal layer over the first high-κ dielectric layer, forming a P-metal layer over the first mid-gap metal layer; and forming a first fully silicided layer over the P-metal layer. The forming an NMOS gate structure comprises forming a second high-κ dielectric layer, forming a second mid-gap metal layer over the second high-κ dielectric layer; and forming a second fully silicided layer over the second mid-gap metal layer.

In accordance with yet another embodiment, a method of forming a semiconductor device comprises forming a high-κ layer of $HfO_2$ on a substrate, wherein the substrate includes a PMOS region and an NMOS region. A TiN layer is formed on the high-κ layer and a TaCNO layer is formed on the TiN layer in the PMOS region of the substrate. A first single phase fully silicided polysilicon gate stack region is formed in the PMOS region and a second single phase fully silicided polysilicon gate stack is formed in the NMOS region. Source/drain regions are formed in both the NMOS regions and the PMOS regions.

An advantage of an illustrative embodiment may be to provide the same phase Ni silicide on both the NMOS and PMOS FUSI structures. This hybrid metal FUSI structure may be a more robust and simplified process than the prior art methods and systems. A further advantage of an illustrative embodiment of the present invention is that the method and system may eliminate/minimize the gate oxide integrity damage that may be induced in the prior art by full-gate silicidation-induced stress and dual metal gate etching.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to illustrative embodiments in a specific context, namely a CMOS semiconductor device. The invention may also be applied, however, to other semiconductor devices, for example, bipolar and bi-CMOS devices.

In the fabrication of high performance CMOS devices with ultra-thin gate dielectrics and polysilicon gates, the depletion layer formed in a polysilicon gate in inversion bias becomes a significant fraction of the gate capacitance and degrades the device performance. The use of a metal gate in these CMOS devices alleviates this problem. Two different metals with appropriate work functions may be used: a first metal with a first work function for the PMOS area and a second metal with a second work function for the NMOS area. However, this approach adds significant cost and complexity to the process. Alternatively, the same metal can be used for the gate of both the PMOS area and the NMOS area with a mid-gap work function. However, for CMOS mid-gap work function metal gates, the threshold voltage for both the PMOS area and the NMOS area may become unacceptably high.

To eliminate the gate depletion effect and enhance transistor performance, FUSI gates have been introduced as a replacement of conventional poly-Si gates and dual metal gates. A Ni-based FUSI process may be implemented for sub-45 nm CMOS applications, since it eliminates poly depletion, it is compatible with high-k dielectrics, and the material involved is well known in the industry and can be integrated in a conventional CMOS flow. However, as noted above, different phase FUSI processes may add unacceptable complexity to the process flow. Therefore, it would be advantageous to overcome the deficiencies in the existing art by providing a process, system, and structure for tuning gate work functions without a dual metal process or a dual silicide phase process.

Gate work functions may be tuned by stacking bi-layers of metals with differing work functions. The present invention relates to a method of manufacturing, a system, and a structure for a hybrid metal FUSI gate.

Figure 1A:
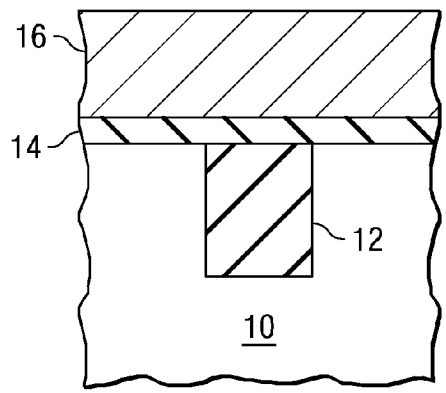
FIGS. 1a to 1d illustrate cross-sectional views of the process for forming dual gates in a semiconductor device according to the prior art.
Figure 1B:
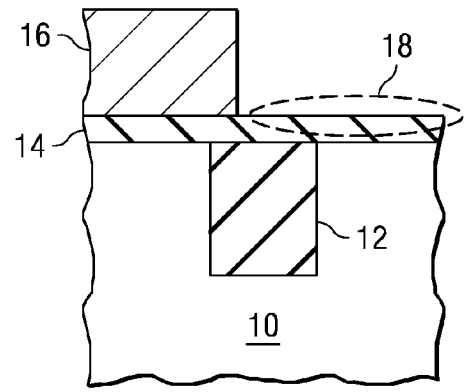
Figure 1C:
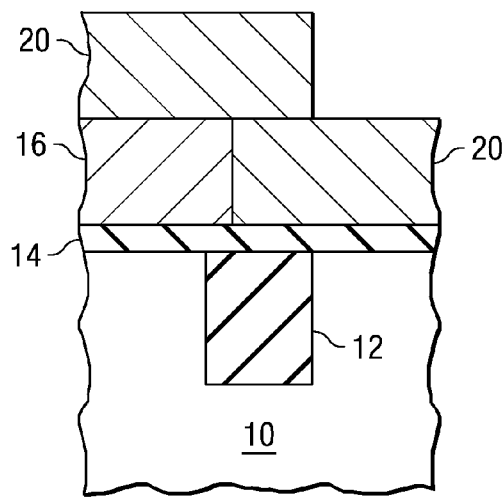
Figure 1D:
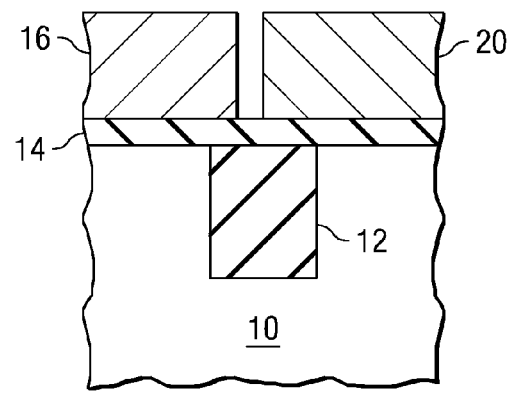
Figure 2A:
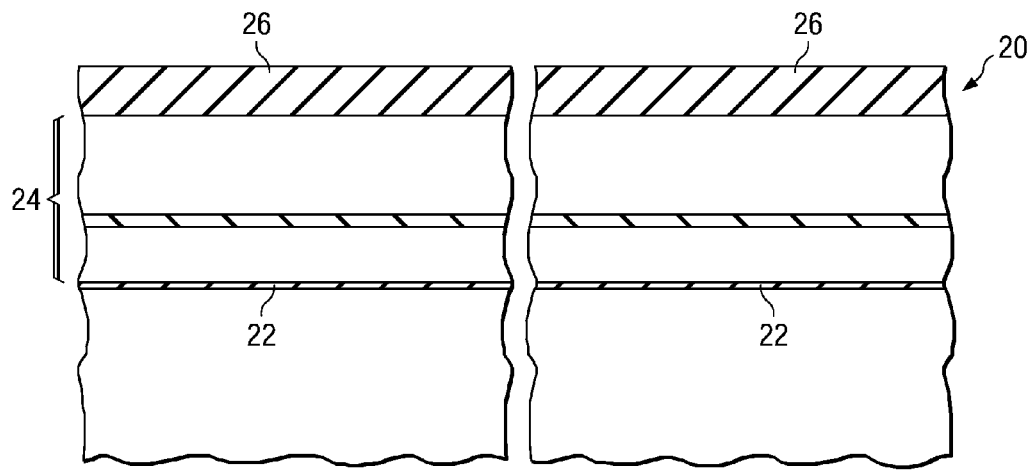
FIGS. 2a to 2q illustrate cross-sectional views of the process for forming different phase fully silicided (FUSI) gates in a semiconductor device according to the prior art.
Figure 2B:
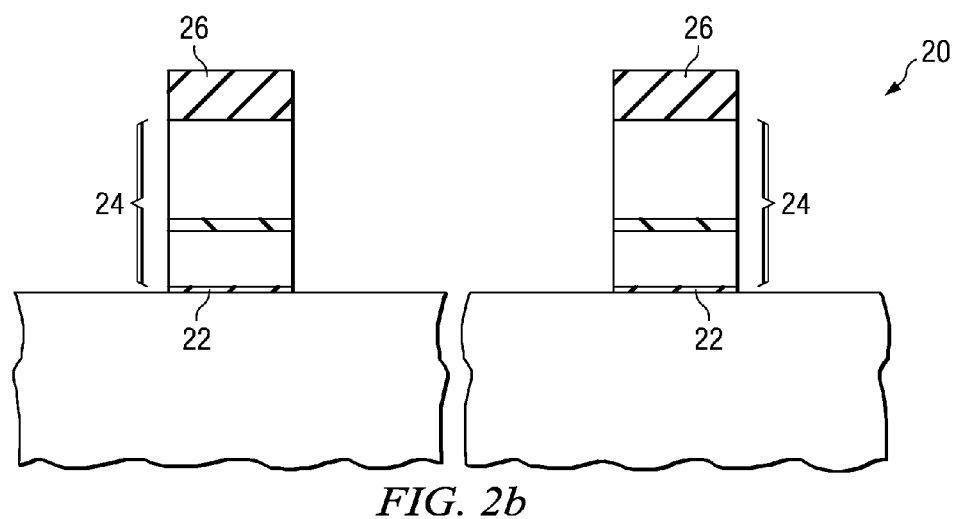
Figure 2C:
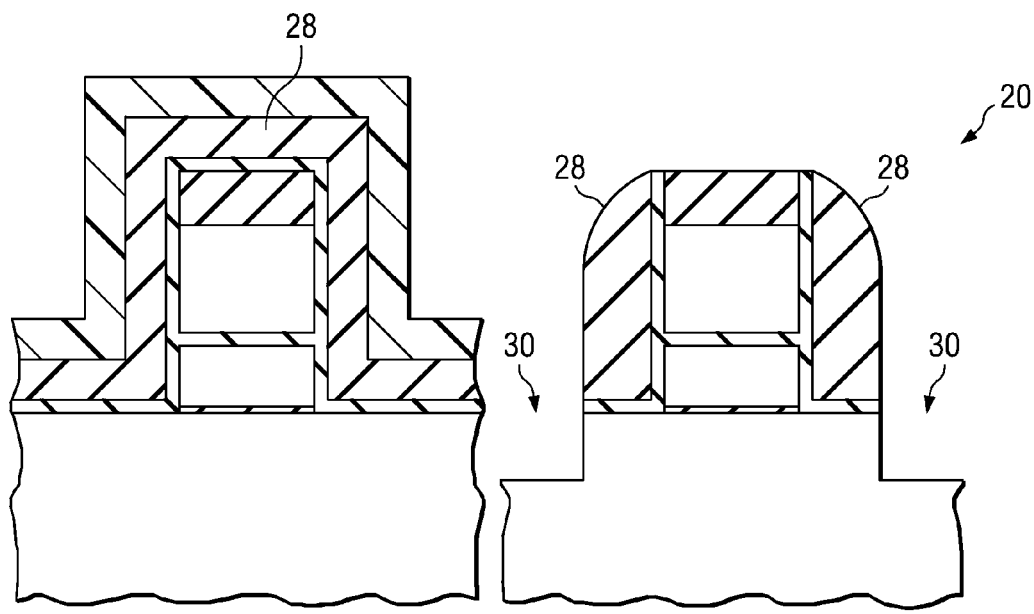
Figure 2D:
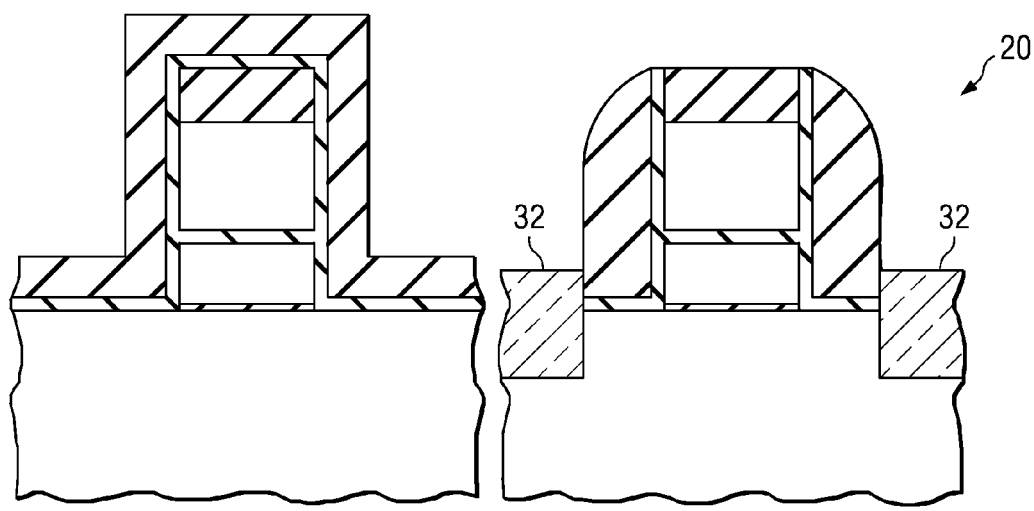
Figure 2E:
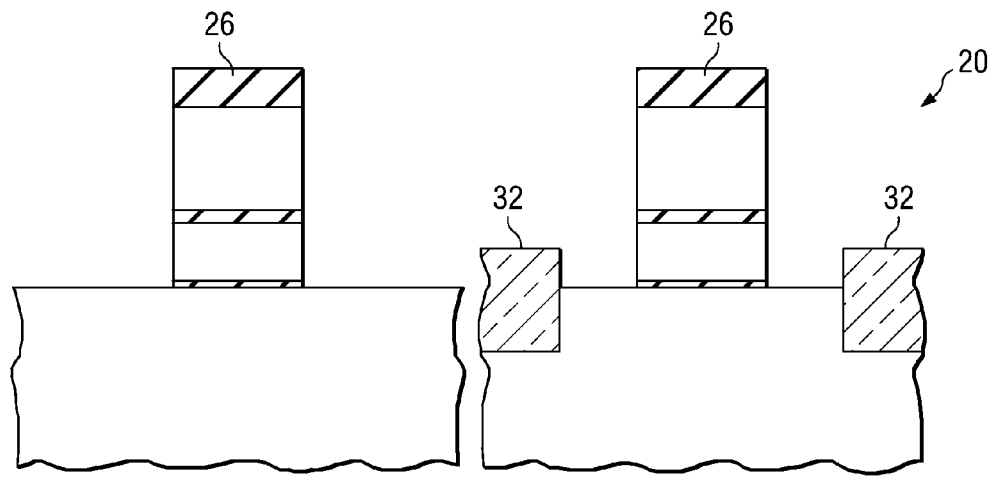
Figure 2F:
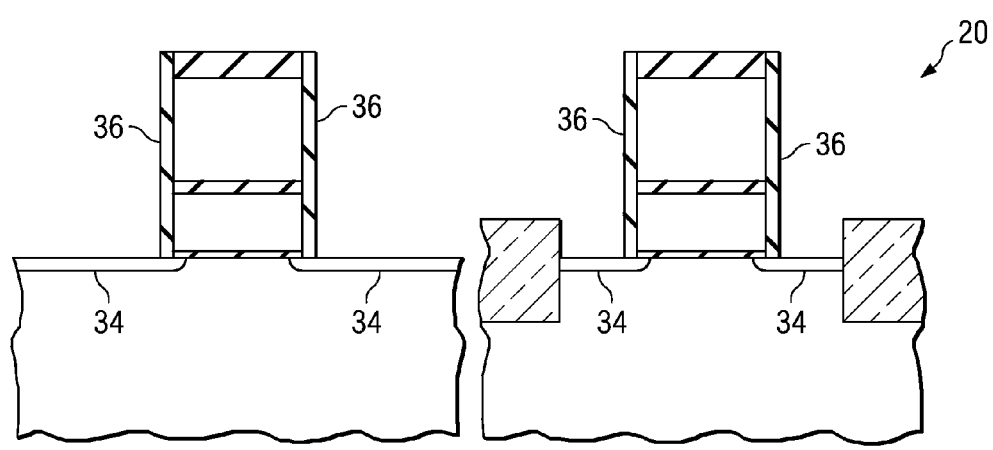
Figure 2G:
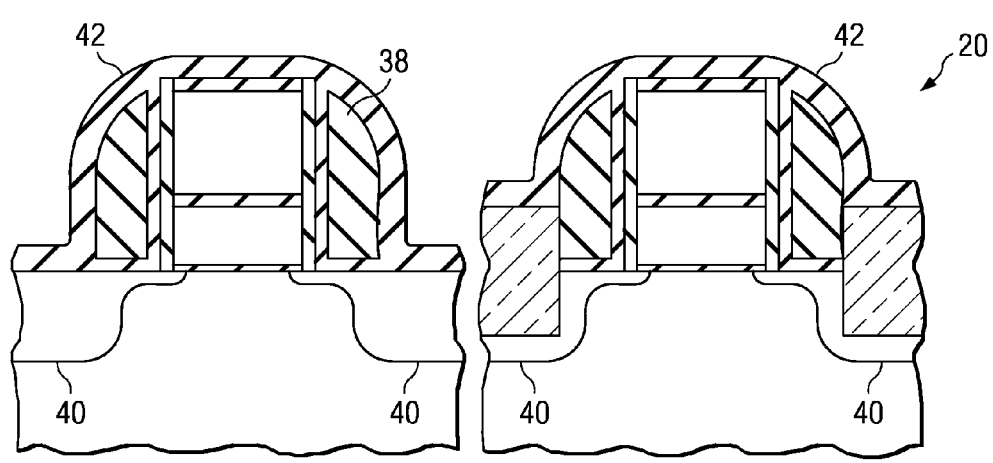
Figure 2H:
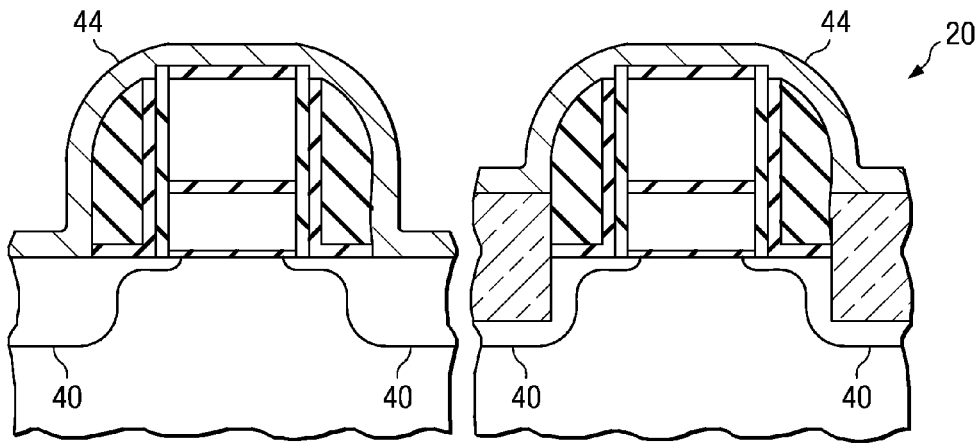
Figure 2I:
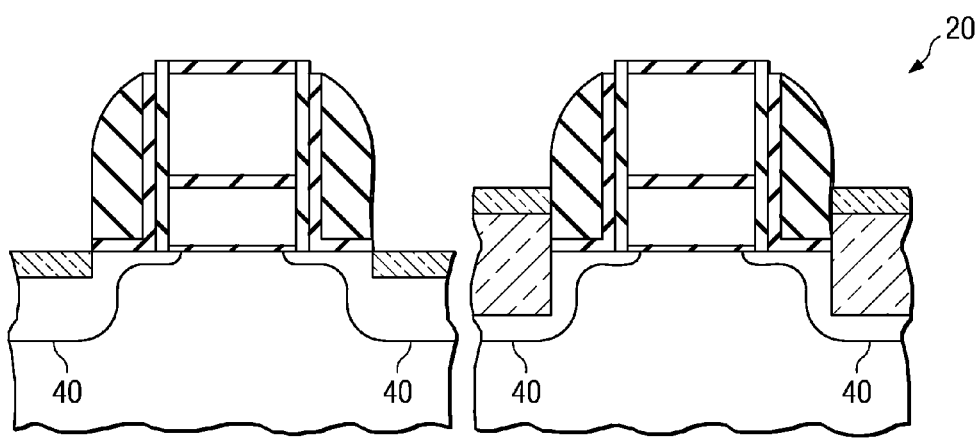
Figure 2J:
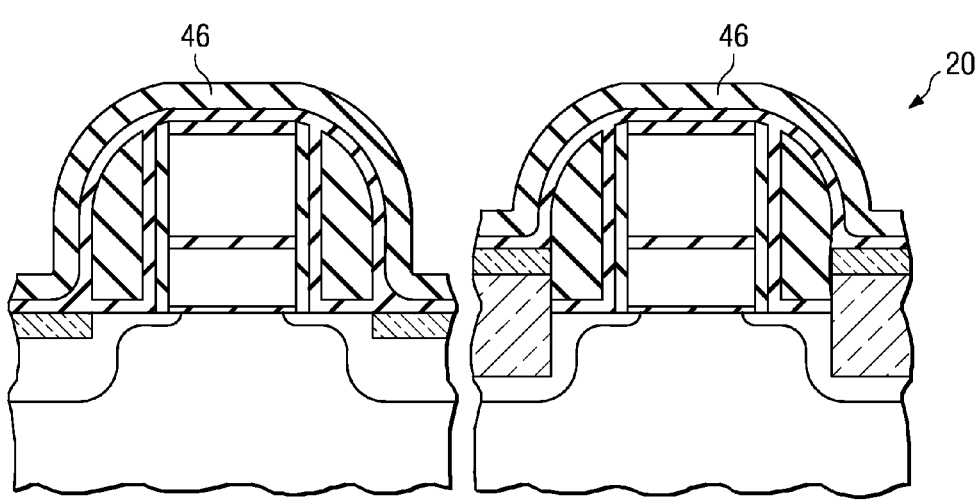
Figure 2K:
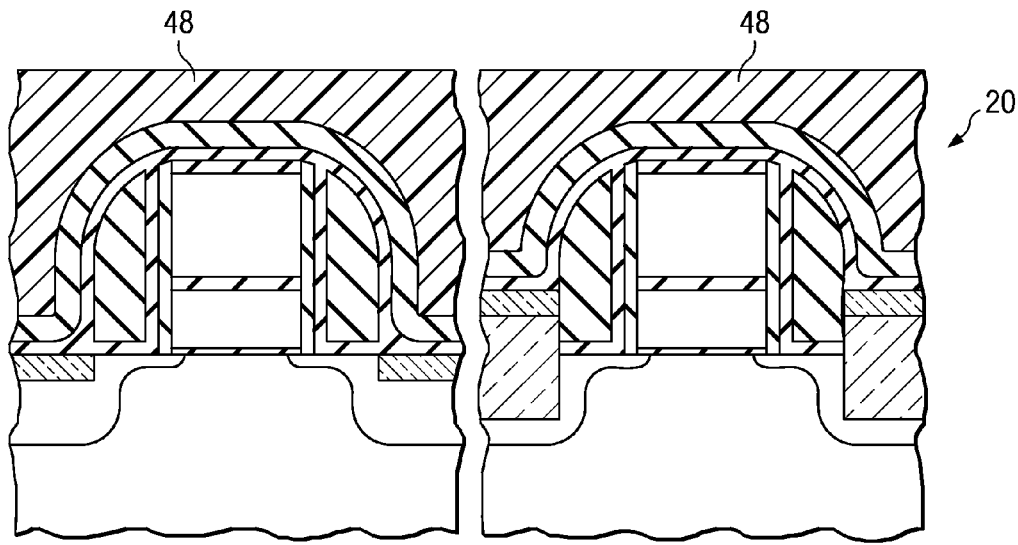
Figure 2L:
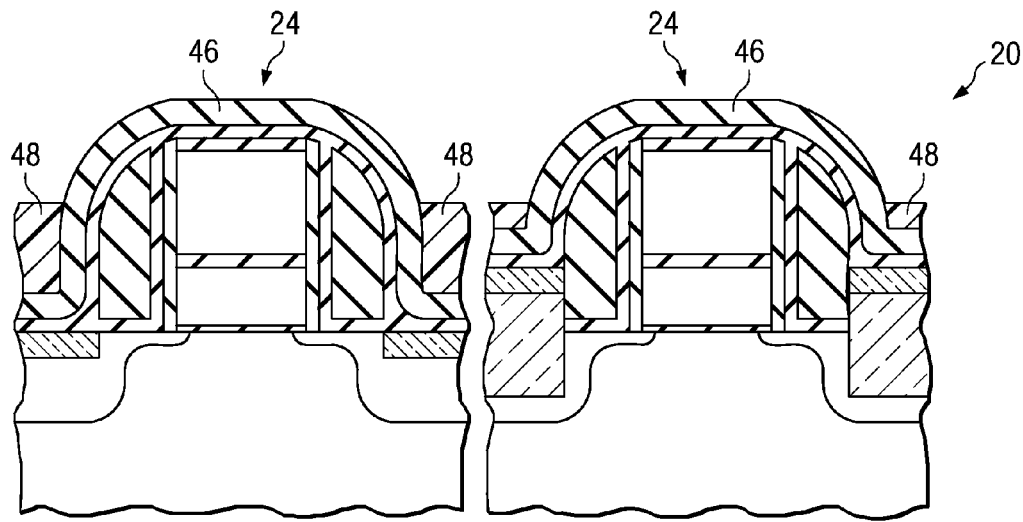
Figure 2M:
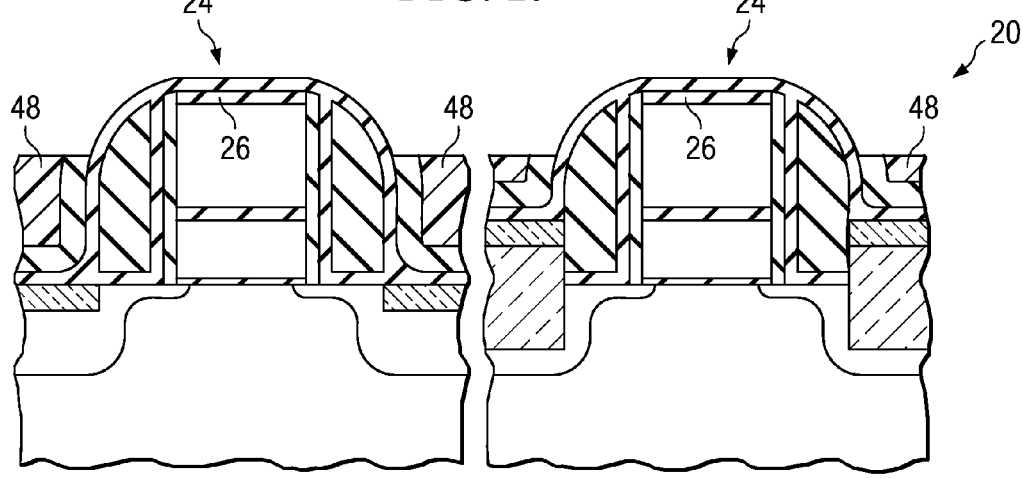
Figure 2N:
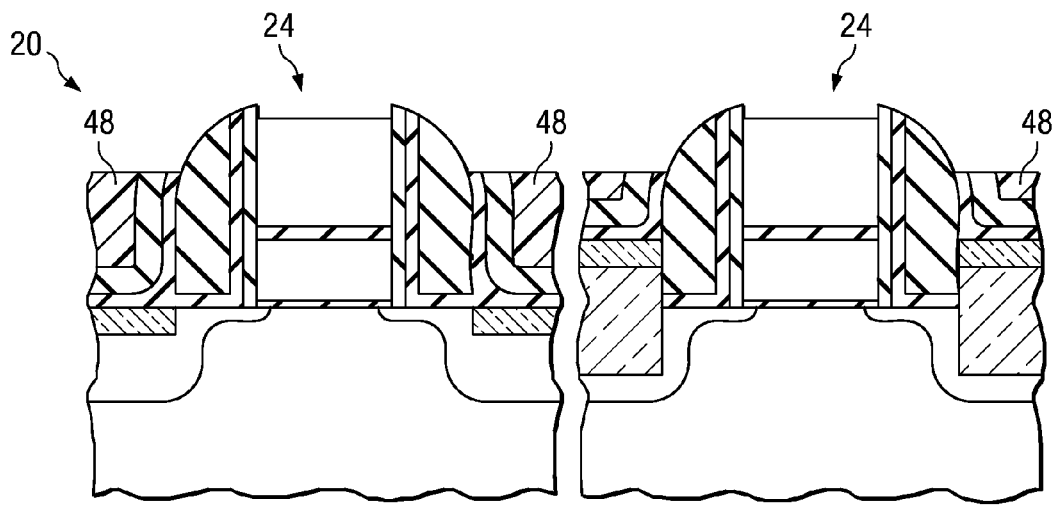
Figure 2O:
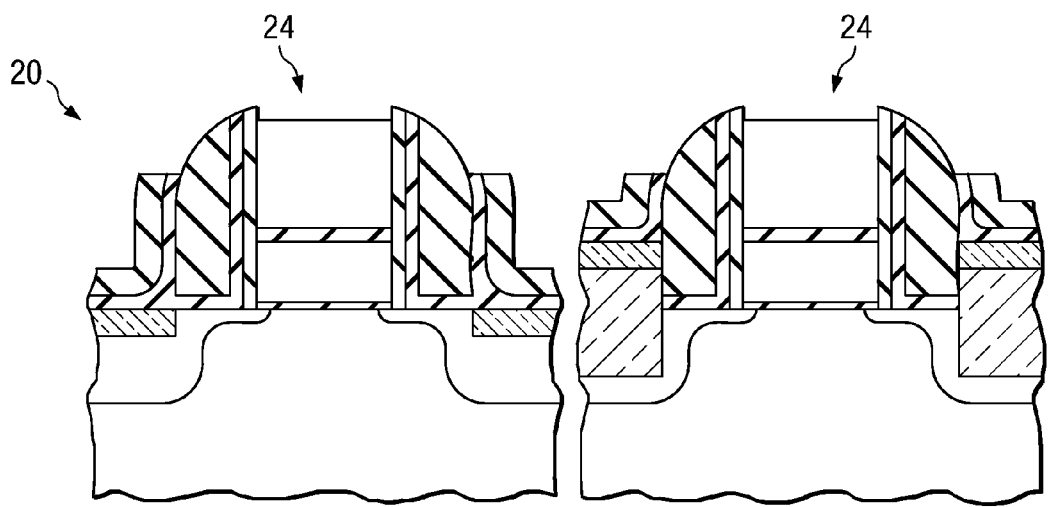
Figure 2P:
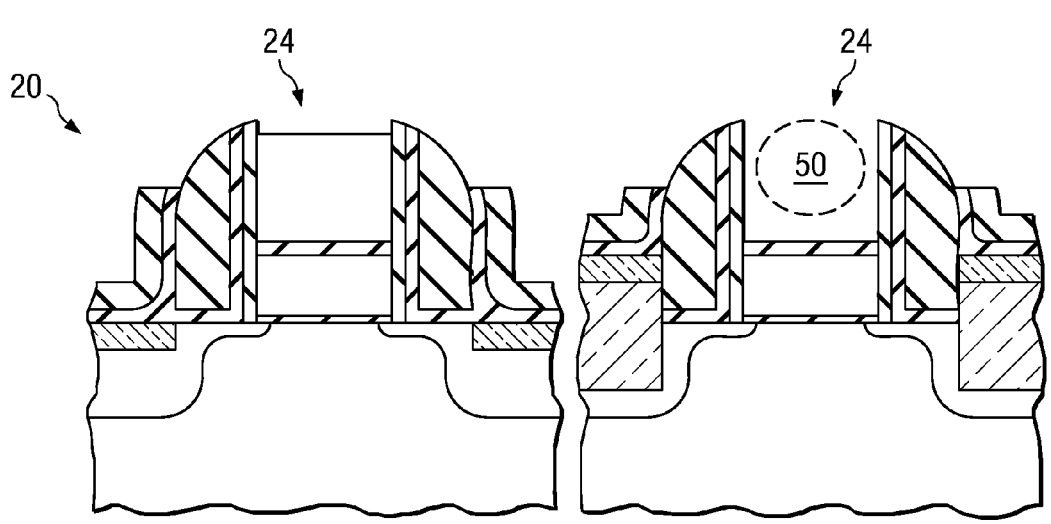
Figure 2Q:
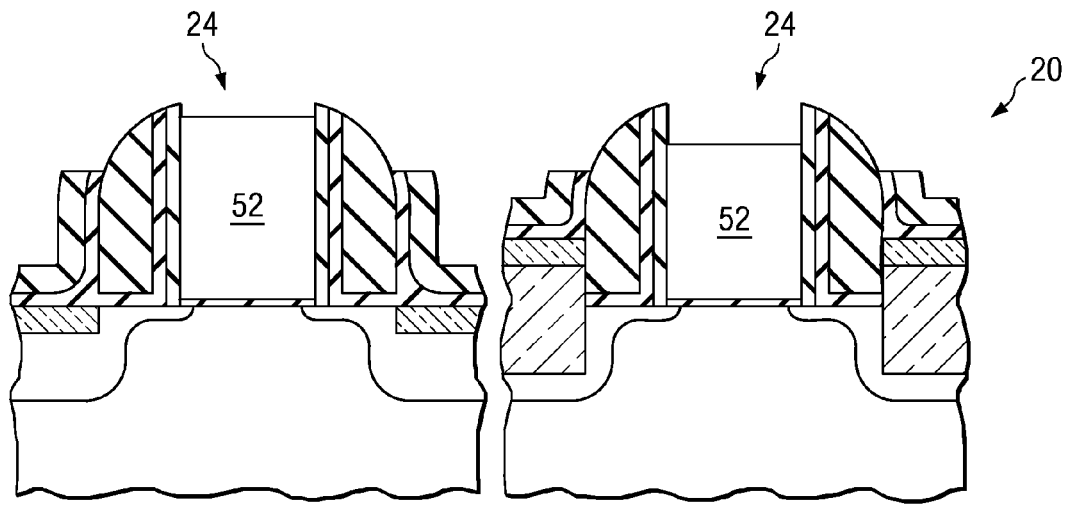
Figure 3A:
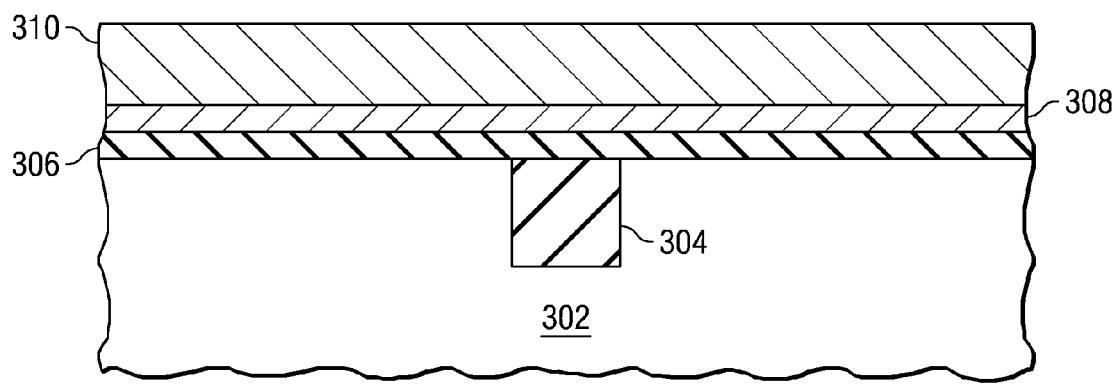
FIGS. 3a to 3h are cross-sectional views of a hybrid metal FUSI gates in accordance with the illustrative embodiments of the present invention.

With reference now to FIG. 3a, there is shown a semiconductor substrate 302 including a shallow trench isolation region 304 and well regions appropriate for PMOS and NMOS structures (not shown). The substrate 302 may comprise silicon or other semiconductor material, such as silicon on insulator (SOI). Compound semiconductors, GaAs, InP, Si/Ge, or SiC, as examples, may be used in place of silicon.

The substrate 302 may also include other active components or circuits formed in the front end of line (FEOL), not shown.

A dielectric layer 306 is deposited on substrate 302. The dielectric layer 306 may be a high-κ dielectric layer. High-κ refers to the dielectric constant (κ) of the layer. Dielectrics with dielectric constants greater than the dielectric constant of $SiO_2$ (3.9) are termed high-κ. The high-κ layer 306 may be, for example, hafnium oxide, $HfO_2$. Other high-κ materials may be used within the scope of this embodiment, for example, $HfSiO_x$ or various combinations of layers. Further, the dielectric layer may be a composite high-κ stack and comprise, for example, $HfO_2$, $HfSiO_x$, or other layers or combinations of layers. Still further, the dielectric may not be high-κ and may comprise, for example, $SiO_2$, SiN, or combinations of layers.

Next, a mid-gap metal layer 308 is deposited. A mid-gap metal is a metal with a work function between the Si band-gap (mid-gap WF=4.65 eV). An appropriate mid-gap metal may be, for example, titanium nitride (TiN), $Ti_xW_y$, or TaN. In an illustrative embodiment, TiN may be deposited by low pressure chemical vapor deposition (LPCVD). TiN is an example of mid-gap metal with a work function determined to be about 4.65 eV. TiN may be conventionally used in silicon technology as a separating barrier to prevent potentially harmful interactions between silicon and metal. Mid-gap layer 308 may be formed with a thickness range between about 5 Å and 30 Å, preferably 15 Å. Mid-gap metal layer 308 is followed by the deposition of P-metal layer 310. A P-metal may have a work function of about 4.85 eV to about 5.3 eV, preferably about 5 eV. An appropriate P-metal may be, for example, $WN_x$, $MoN_x$, $TaAl_yN_x$, $TiAl_yN_x$, TiC or tantalum carbide nitride with oxygen TaCNO. P-metal layer 310 may have a thickness range of 30 Å to 500 Å, preferably 50 Å. TaCNO has a suitable metal work function and a good thermal stability, which is typically higher than the highest temperature required by the backend very large-scale integration process.

Figure 3B:
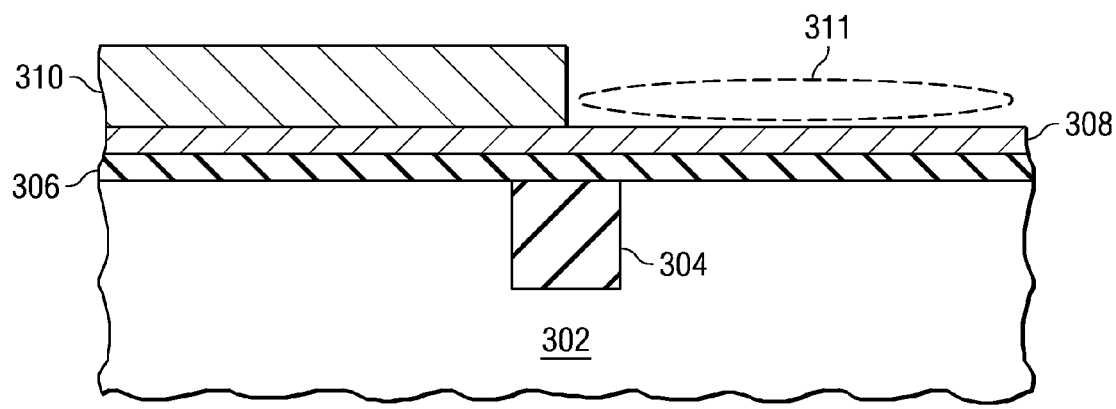

Turning to FIG. 3b, P-metal layer 310 has been patterned, and the P-metal in the NMOS region 311 is etched away. The thin mid-gap layer 308 may act as an effective etch stop layer for metal etching the NMOS region 311; therefore, the damage to the high-κ dielectric layer 306 is minimized or eliminated.

Figure 3C:
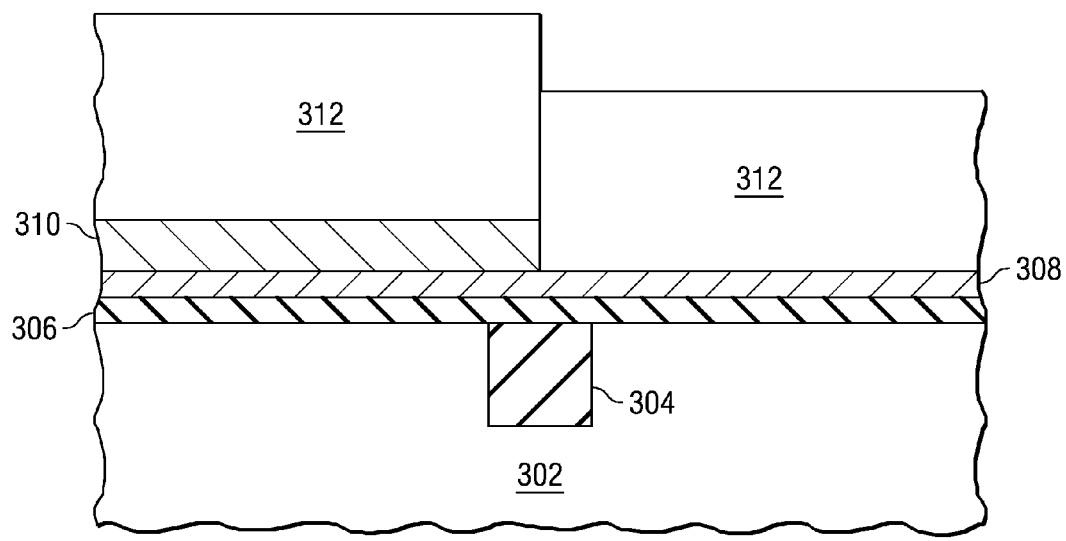

FIG. 3c shows a view of a resultant cross-section following the deposition of a conventional polysilicon layer 312. The polysilicon may be in the thickness range of 300 Å to 1500 Å, preferably about 600 Å. The polysilicon layer may be undoped, in-situ doped, or doped subsequently in a diffusion or implant process.

Figure 3D:
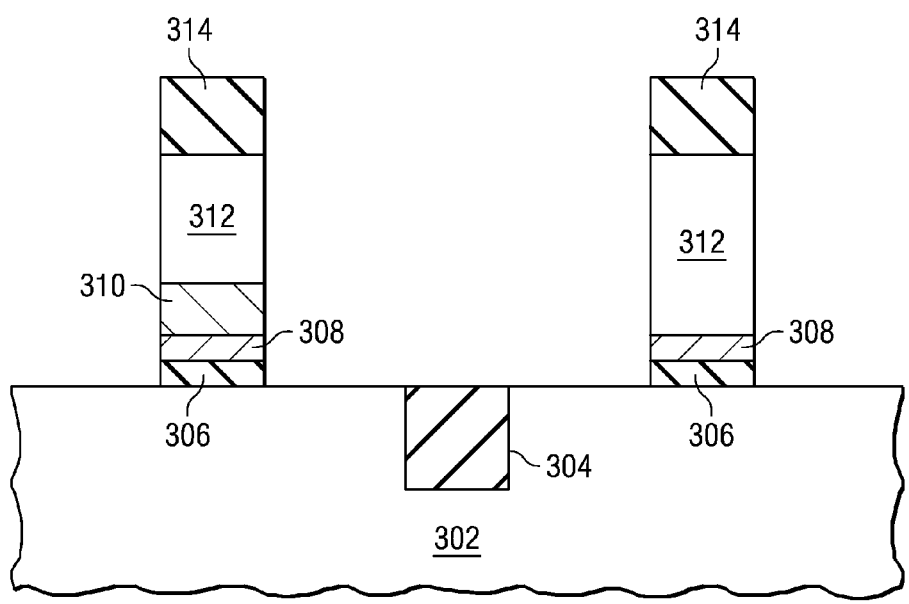
Figure 3E:
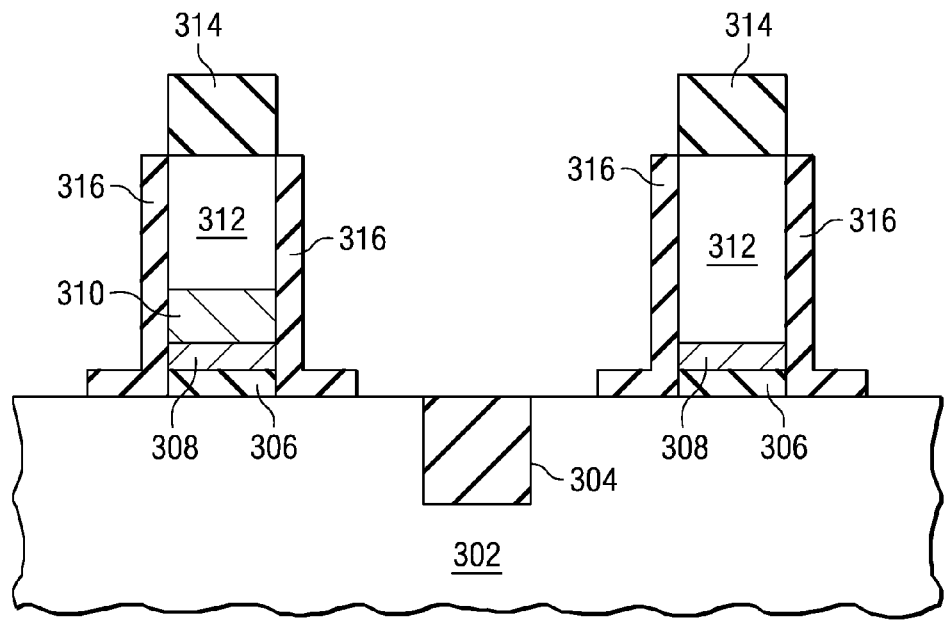
Figure 3F:
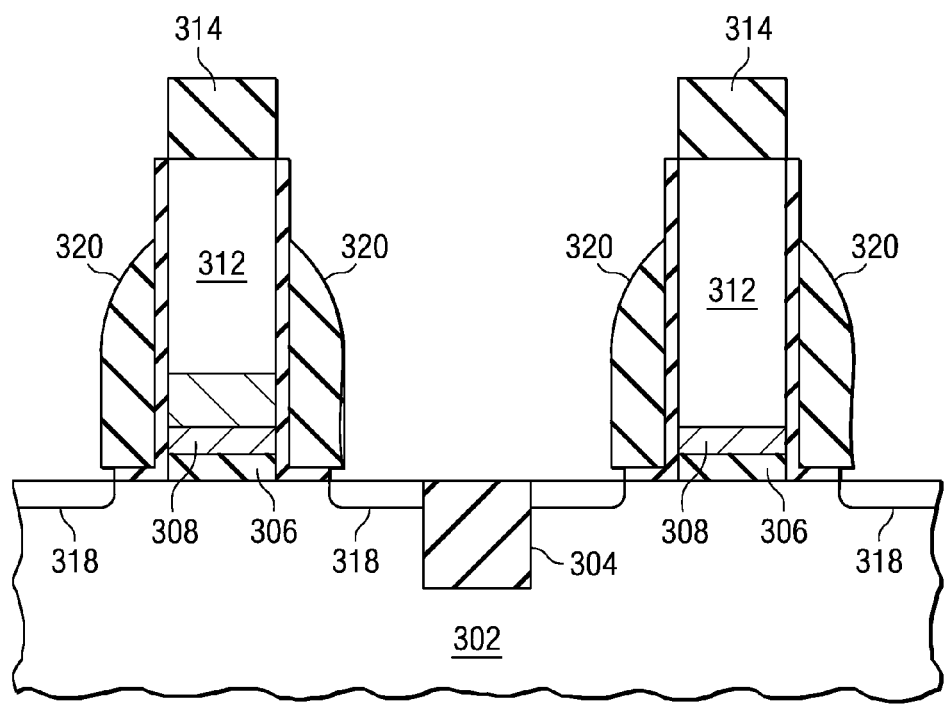

FIG. 3d shows the resultant cross-sectional view of the structure following the deposition and patterning of hard mask layer 314 and gate etch. The gate etch process uses hard mask layer 314 to protect the polysilicon over the gate. An LDD implant and anneal according to conventional processing may follow (not shown). FIG. 3e shows initial spacers 316 may be formed through, as an example, $SiO_2$ and/or SiN deposition and etching. FIG. 3f, shows secondary spacers 320, which may be, as an example, SiN, and/or SiO2, or other dielectric material. Source/drain regions 318 are shown implanted and annealed. The thin mid-gap layer 308 may also act as an effective diffusion barrier for blocking the penetration of implanted Sb, As, Phos, B, or Al into dielectric layer 306. Source/drain regions 318 are then silicided. The polysilicon regions 312 are not silicided during this step. Hard mask layer 314 and spacers 316 and 320 block the silicidation process on the polysilicon regions 312.

Figure 3G:
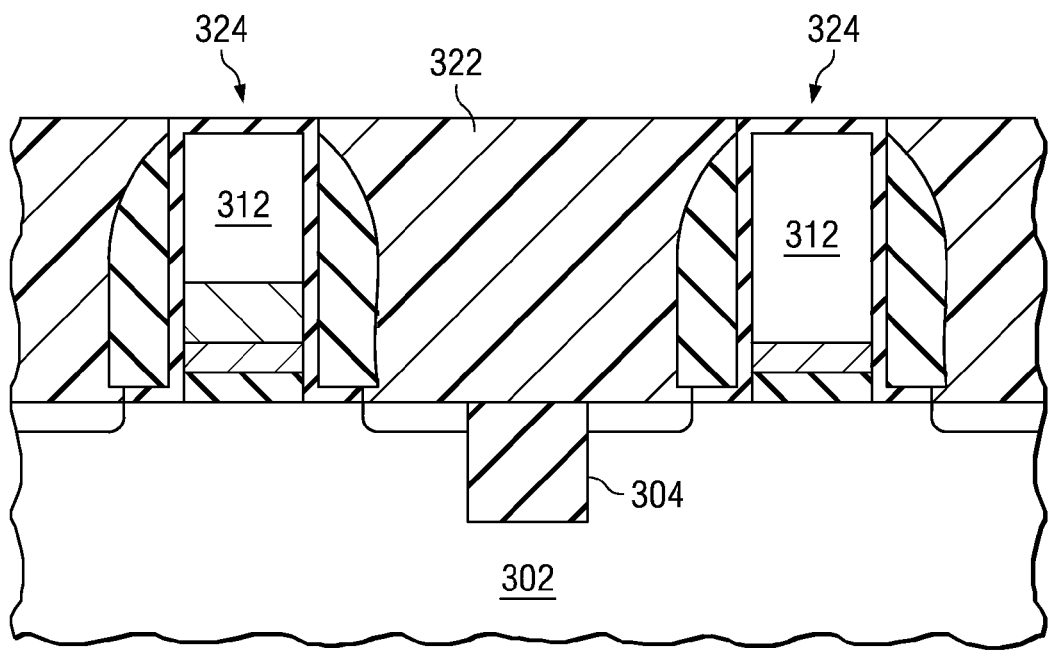

FIG. 3g shows the resultant cross-sectional view following a single or successive inter-level dielectric depositions 322 and chemical mechanical polish steps. The top surface of the polysilicon gate 324 is thereby exposed and the substrate 302 is planarized.

Figure 3H:
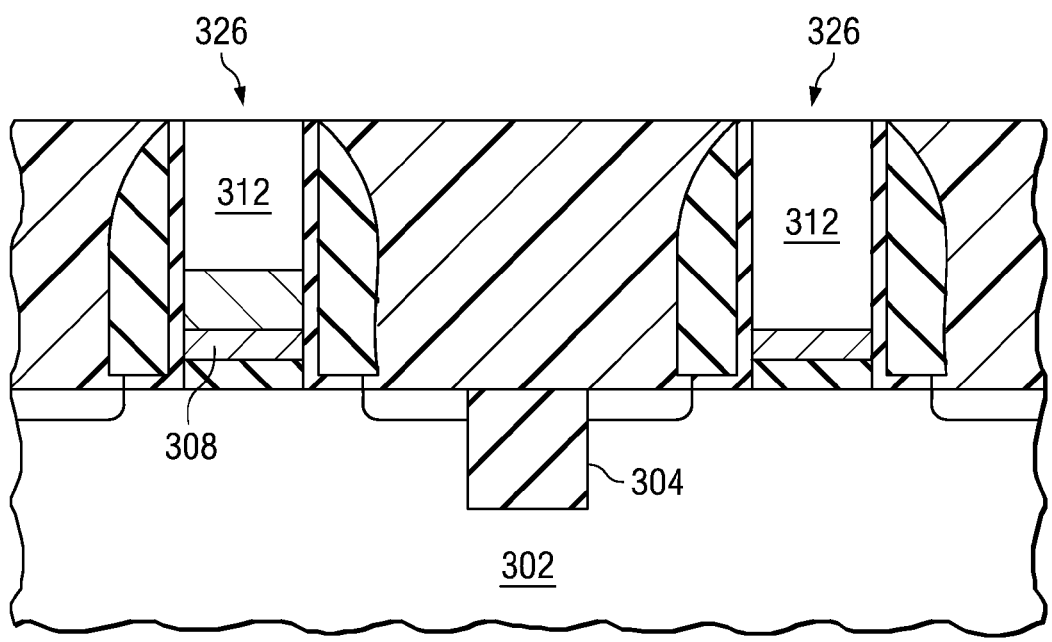

FIG. 3h shows the substrate following a conventional single phase NiSi-FUSI gate silicidation process. The fully silicided areas 326 are shown. In an illustrative embodiment, the Ni deposition is within the range of 100 Å to 1000 Å, preferably 350 Å. The deposition is followed by a rapid thermal anneal in the range of 100 C to 800 C, preferably 350 C, for between 5 s and 600 s, preferably 120 s. Nickel silicide (NiSi) has a resistivity that is comparable to $TiSi_2$ and $CoSi_2$, but NiSi features a lower temperature of formation. NiSi also may consume less silicon than $TiSi_2$ and $CoSi_2$; only 1.82 nm of Si may be consumed per nm of metal. However, use of $TiSi_2$ and $CoSi_2$, as well as other silicidation metals, are within the scope of this embodiment. Three different nickel silicide phases are possible, depending on the temperature of formation. Nickel monosilicide, NiSi, may be the desired phase due to its low resistivity of 14-20 micro-ohm-cm.

The un-reacted Ni is then selectively removed. The substrate 302 is then annealed at a temperature in the range of 200 C to 800 C, preferably 450 C, for about 5 s to 600 s, preferably 120 s. The thin mid-gap metal 308 may act as an effective buffer layer for the stress induced by the full-silicidation process; therefore, the damage to the high-κ dielectric may be eliminated or minimized.

Figure 4:
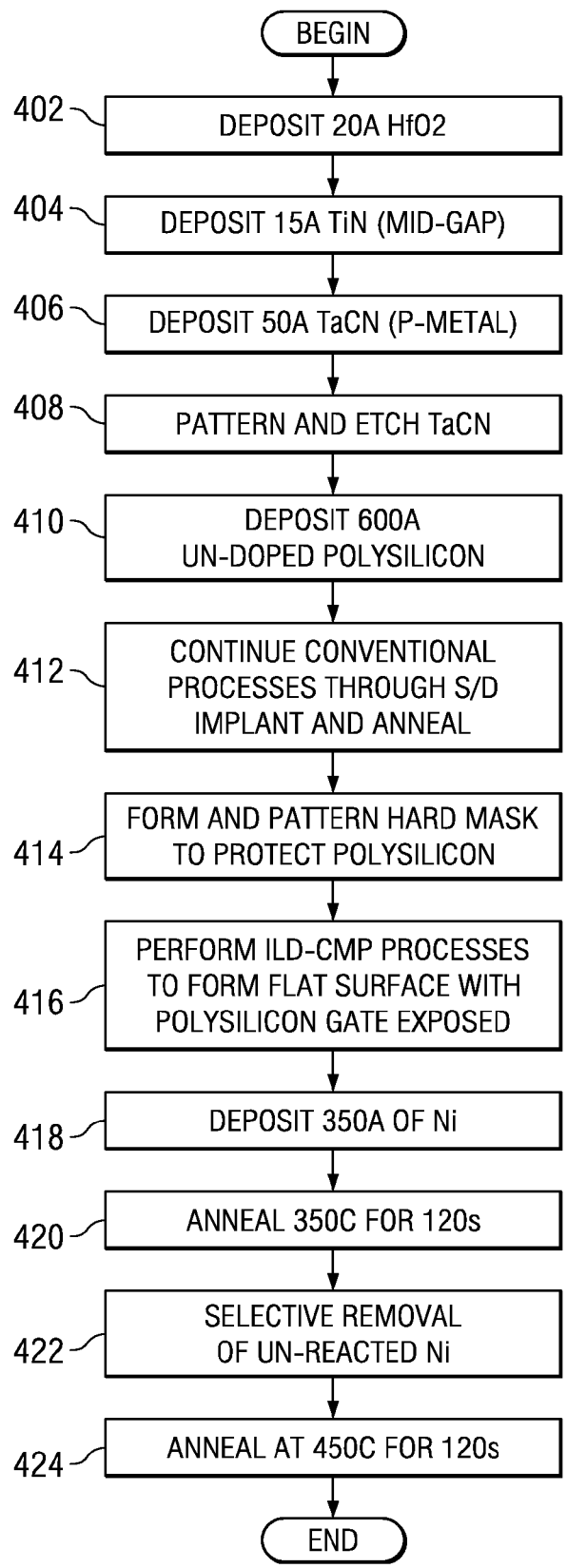
FIG. 4 is a flow chart illustrating an embodiment of a process to manufacture a hybrid metal FUSI gate structure.

FIG. 4 is a flow chart illustrating an embodiment of a process to manufacture a hybrid metal FUSI gate structure. The process begins with a deposition of a dielectric (step 402), such as the high-κ dielectric, $HfO_2$, which is formed on a semiconductor substrate containing shallow trench isolation (STI) regions, N-well and P-well regions appropriate for constructing PMOS and NMOS transistors. The substrate may be semiconductor silicon, bulk silicon, or SOI. Further, the dielectric layer may, for example, be formed as HfSiON with 50% Hf/(Hf+Si), or other such combination. The $HfO_2$ layer, such as layer 306 in FIG. 3, may have a range of thickness between about 5 Å and 100 Å. An appropriate thickness is, for example, 20 Å.

Next, a mid-gap metal layer is deposited (step 404). TiN is an example of mid-gap metal with a work function determined to be about 4.65 eV. The mid-gap layer 308 may be formed with a thickness range between about 5 Å and 30 Å, preferably 15 Å.

In an illustrative embodiment, a P-metal such as TaCNO, is deposited (step 406) on the TiN layer. TaCNO films may be thermally deposited at a low temperature about ≦400° C. using single source pentakis(diethylamido)tantalum (PDEAT) as a precursor. The activation energy of the surface reaction is about 0.79 eV, and the maximum deposition rate obtained may be about 100 Å/min at 350° C. The resistivity of the as-deposited film may decrease as the deposition temperature increases, and the minimum value of resistivity obtained may be about 6000 μΩ-cm for a sample deposited at 400° C. The TaCNO layer may be formed to a thickness of about 30 Å to 500 Å, with an example thickness of 50 Å. The TaCNO layer is patterned and removed from the NMOS region, as illustrated in FIG. 3b, in an etch process (step 408). A layer of polysilicon is formed with a thickness of about 600 Å (step 410). The polysilicon may be undoped; however, it is within the scope of this embodiment to form a doped layer of polysilicon. The substrate then is processed using conventional processes through source/drain implants and anneals (step 412).

Following step 412, a hard mask is formed and patterned to protect the polysilicon layer in the gate stack (step 414). The hard mask may be a silicon oxide or silicon nitride, for example. Next, a series of processes involving deposition of an inter-level-dielectric layer (ILD) and a chemical mechanical polish process is accomplished to planarize the substrate surface and expose the polysilicon gate stack (step 416). A deposition of Ni layer (step 418) is implemented with a thickness between about 100 Å and 1000 Å, for example, 350 Å. The substrate then undergoes a first anneal with a temperature of about 350 C for about 120 s (step 420). The anneal may be implemented as a spike, flash, or laser anneal. The un-reacted Ni is then removed from the substrate (422) and the substrate undergoes a second anneal (424), thus ending the process. The second anneal is implemented at a temperature higher than the first anneal. The second anneal may also be implemented as a spike, flash, or laser anneal.

Although the present invention and its advantages have been described in detail, it should be understood that various changes, substitutions, and alterations can be made herein without departing from the spirit and scope of the invention as defined by the appended claims. For example, many of the materials and processes discussed above can be implemented with comparable materials, other processes, or a combination thereof. As another example, it will be readily understood by those skilled in the art that types of conductors and insulators may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device comprising:
   providing a semiconductor substrate having a PMOS area and an NMOS area;
   forming a dielectric layer on the PMOS area and the NMOS area;
   forming a mid-gap metal layer on the dielectric layer;
   forming a PMOS gate electrode, wherein the forming the PMOS gate electrode comprises forming a P-metal layer on the mid-gap metal layer and forming a first polysilicon region on the P-metal layer;
   forming an NMOS gate electrode, wherein the forming the NMOS gate electrode comprises forming a second polysilicon region disposed on the mid-gap metal layer; and
   siliciding the first polysilicon region and the second polysilicon region until the first polysilicon region and the second polysilicon region are fully silicided.

2. The method of claim 1, wherein the dielectric layer is selected from a group consisting essentially of $HfO_2$, $HfSiO_x$, $SiO_2$, SiN, and combinations thereof.

3. The method of claim 2, wherein the dielectric layer has a thickness of about 20 Å.

4. The method of claim 1, wherein the mid-gap metal layer is selected from a group consisting essentially of TiN, $Ti_xW_y$, or TaN.

5. The method of claim 4, wherein the mid-gap metal layer has a thickness of about 15 Å.

6. The method of claim 1, wherein the P-metal layer is selected from a group consisting essentially of WNx, MoNx, TaAlyNx, TiAlyNx, TaCNO, and TiC.

7. The method of claim 1, wherein the P-metal layer has a thickness of about 50 Å.

8. The method of claim 1, wherein the first polysilicon region has a thickness of about 600 Å.

9. The method of claim 1, further comprising planerizing the first polysilicon region using a chemical mechanical polish process.

10. The method of claim 1, wherein the siliciding the first polysilicon region and the second polysilicon region further comprises forming a nickel layer adjacent to the first polysilicon region and the second polysilicon region.

11. The method of claim 10, wherein the nickel layer has a thickness of about 350 Å.

12. The method of claim 10, wherein the siliciding the first polysilicon region and the second polysilicon region forms a single phase NiSi.

13. A method of forming a semiconductor device, the method comprising:
   forming a PMOS gate structure, the forming the PMOS gate structure comprising:
      forming a first high-κ dielectric layer;
      forming a first mid-gap metal layer over the first high-κ dielectric layer;
      forming a P-metal layer over the first mid-gap metal layer; and
      forming a first fully silicided layer over the P-metal layer; and
   forming an NMOS gate structure, the forming the NMOS gate structure comprising:
      forming a second high-κ dielectric layer;
      forming a second mid-gap metal layer over the second high-κ dielectric layer; and
      forming a second fully silicided layer over the second mid-gap metal layer.

14. The method of claim 13, wherein the forming the first high-κ dielectric layer and the forming the second high-κ dielectric layer are performed simultaneously.

15. The method of claim 13, wherein the forming the NMOS gate structure further comprises forming an N-metal layer disposed between the mid-gap metal layer and the second fully silicided layer.

16. The method of claim 13, wherein the forming the first high-κ dielectric layer further comprises forming a layer of $HfO_2$ to a thickness of about 20 Å.

17. The method of claim 13, wherein the forming the mid-gap metal layer further comprises forming a layer of TiN to a thickness of about 15 Å.

18. The method of claim 13, wherein the forming the first fully silicided layer forms a single phase NiSi.

19. A method of forming a semiconductor device, the method comprising:
   forming a high-κ layer of $HfO_2$ on a substrate, wherein the substrate includes a PMOS region and an NMOS region;
   forming a TiN layer on the high-κ layer;
   forming a TaCNO layer on the TiN layer in the PMOS region of the substrate, the forming the TaCNO layer leaving the NMOS region free from the TaCNO layer;
   forming a first single phase fully silicided polysilicon gate stack region in the PMOS region;
   forming a second single phase fully silicided polysilicon gate stack in the NMOS region; and
   forming source/drain regions in both the NMOS regions and the PMOS regions.

20. The method of claim 19, wherein the forming the first single phase fully silicided polysilicon gate stack region further comprises:
- forming a first polysilicon region disposed on the PMOS region;
- forming a layer of nickel disposed on the first polysilicon region; and
- reacting the first polysilicon region and the layer of nickel to form the first single phase fully silicided polysilicon gate stack.

* * * * *